United States Patent
Lee et al.

(10) Patent No.: US 11,394,374 B2
(45) Date of Patent: Jul. 19, 2022

(54) SEMICONDUCTOR DEVICE

(71) Applicant: SAMSUNG ELECTRONICS CO., LTD., Suwon-si (KR)

(72) Inventors: Hyun Lee, Incheon (KR); Min Su Kim, Hwaseong-si (KR); Ah Reum Kim, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/866,941

(22) Filed: May 5, 2020

(65) Prior Publication Data

US 2021/0119617 A1    Apr. 22, 2021

(30) Foreign Application Priority Data

Oct. 16, 2019 (KR) .................. 10-2019-0128368

(51) Int. Cl.
*H03K 3/3562* (2006.01)
*H01L 27/02* (2006.01)
*H01L 23/528* (2006.01)

(52) U.S. Cl.
CPC ....... *H03K 3/35625* (2013.01); *H01L 23/528* (2013.01); *H01L 27/0207* (2013.01)

(58) Field of Classification Search
None
See application file for complete search history.

(56) References Cited

U.S. PATENT DOCUMENTS

| | | |
|---|---|---|
| 4,999,528 A | 3/1991 | Keech |
| 5,517,132 A | 5/1996 | Ohara |
| 5,784,384 A | 7/1998 | Maeno |
| 6,687,890 B2 | 2/2004 | Sato |
| 6,934,780 B2 | 8/2005 | Modelski et al. |
| 7,843,218 B1 | 11/2010 | Ramaraju et al. |
| 7,919,792 B2 | 4/2011 | Law et al. |
| 9,641,161 B1 | 5/2017 | Liu et al. |
| 10,511,293 B2 * | 12/2019 | Seo ................ H01L 27/0207 |
| 2008/0218233 A1 * | 9/2008 | Yamamoto ........ H03K 3/35625 327/198 |
| 2015/0358004 A1 * | 12/2015 | Shirai ................ H03K 21/00 327/115 |

* cited by examiner

*Primary Examiner* — Cassandra F Cox
(74) *Attorney, Agent, or Firm* — Sughrue Mion, PLLC

(57) ABSTRACT

A semiconductor device is provided. The semiconductor device includes a clock gate line supplying a clock signal, an inverted clock gate line disposed in parallel to the clock gate line and supplying an inverted clock signal, a first latch circuit performing a first latch operation based on the clock signal and the inverted clock signal and a second latch circuit disposed on a side of the first latch circuit in a first direction, receiving an output of the first latch circuit, and operating based on the clock signal and the inverted clock, wherein the clock gate line and the inverted clock gate line extend in the first direction and are shared by the first and second latch circuits.

21 Claims, 18 Drawing Sheets

SEMICONDUCTOR DEVICE

CROSS-REFERENCE TO RELATED APPLICATION

This application is based on and claims priority under 35 U.S.C. § 119 from Korean Patent Application No. 10-2019-0128368, filed on Oct. 16, 2019, the disclosure of which is incorporated herein by reference in its entirety.

BACKGROUND

1. Field

The disclosure relates to the circuit layout of a semiconductor device.

2. Description of the Related Art

Recently, in order to improve productivity of integrated circuits (ICs), such as system-on-chips (SoCs), commonly used in mobile devices, it is important to reduce the area of the ICs. However, it is also important to improve the performance of ICs in line with ever-increasing user demands.

As such, in order to minimize the area of ICs while improving the performance of ICs, the design of a semiconductor circuit (e.g., a standard cell) layout capable of implementing all necessary semiconductor elements for improving performance, and at the same time, maintaining as low an area as possible is needed.

SUMMARY

Example embodiments of the disclosure provide a semiconductor device capable of improving the performance of the output driver of a latch or a flipflop while preventing, or minimizing, an increase in the layout area of the latch or flipflop.

However, example embodiments of the disclosure are not restricted to those set forth herein. The above and other example embodiments of the disclosure will become more apparent to one of ordinary skill in the art to which the disclosure pertains by referencing the detailed description of the disclosure given below.

According to an aspect of the disclosure, there is provided a semiconductor device comprising: a clock gate line supplying a clock signal; an inverted clock gate line disposed in parallel to the clock gate line and supplying an inverted clock signal; a first latch circuit configured to perform a first latch operation based on the clock signal and the inverted clock signal; and a second latch circuit arranged on a first side of the first latch circuit in a first direction and configured to receive an output of the first latch circuit and perform second latch operation based on the clock signal and the inverted clock signal, wherein the clock gate line and the inverted clock gate line extend in the first direction and are shared by the first and second latch circuits.

According to an aspect of the disclosure, there is provided a semiconductor device comprising: a plurality of functional circuits arranged in at least two rows, including first and second rows, and configured to operate based on a clock signal and an inverted clock signal; a clock gate line arranged to extend in a column direction and supplying the clock signal; and an inverted clock gate line arranged to extend in the column direction in parallel to the clock gate line and supplying the inverted clock signal, wherein the clock gate line and the inverted clock gate line are shared by functional circuits disposed in each of the at least two rows.

According to another aspect of the disclosure, there is provided a semiconductor a device comprising: at least two inverted clock gate lines arranged to extend in a vertical direction in parallel to each other and supplying an inverted clock signal; a clock gate line arranged to extend in the vertical direction, between the at least two inverted clock gate lines, and to be spaced apart from the at least two inverted clock gate lines, the clock gate line supplying a clock signal; a first functional circuit including the clock gate line and the at least two inverted clock gate lines and operating in accordance with the inverted clock signal and the clock signal; and a second functional circuit arranged to adjoin the first functional circuit in a vertical direction, the second functional circuit sharing the clock gate line and the at least two inverted clock gate lines with the first functional circuit and operating in accordance with the inverted clock signal and the clock signal.

According to another aspect of the disclosure, there is provided a semiconductor device comprising: a clock circuit configured to output a clock signal and an inverted clock signal; a first latch circuit configured to perform a first latch operation based on the clock signal and the inverted clock signal; and a second latch circuit configured to receive an output of the first latch circuit and perform a second latch operation based on the clock signal and the inverted clock signal; a clock gate line configured to supply the clock signal to the first latch circuit and the second latch circuit; an inverted clock gate line configured to supply the clock signal to the first latch circuit and the second latch circuit, wherein the clock circuit is adjacent to the first latch circuit in a first direction, wherein the first latch circuit is adjacent to the second latch circuit in the second direction, wherein the clock gate line and the inverted clock gate line extend in the second direction and are parallel to each other.

Other features and example embodiments may be apparent from the following detailed description, the drawings, and the claims.

BRIEF DESCRIPTION OF THE DRAWINGS

The above and other example embodiments and features of the disclosure will become more apparent by describing in detail example embodiments thereof with reference to the attached drawings, in which.

DETAILED DESCRIPTION

Figure 1:
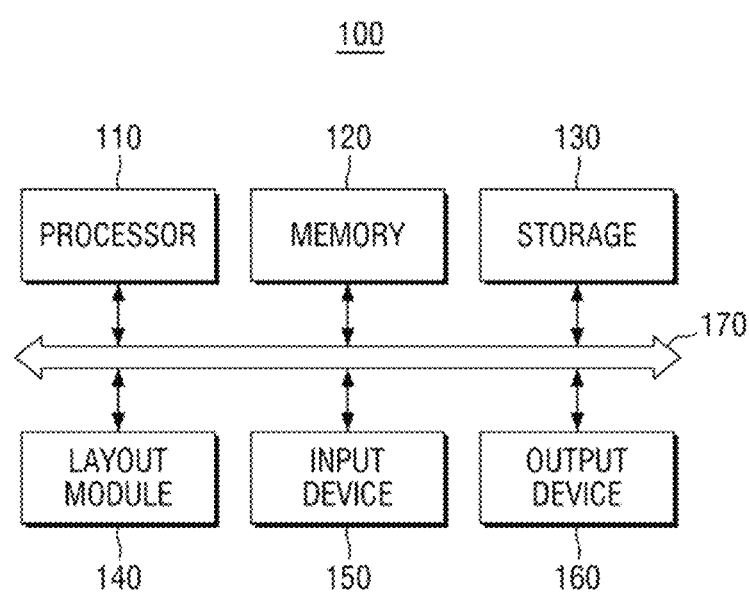
FIG. 1 is a block diagram of a layout system of a semiconductor device according to some example embodiments of the disclosure.

FIG. 1 is a block diagram of a layout system of a semiconductor device according to some example embodiments of the disclosure.

Referring to FIG. 1, a layout system 100 may lay out a semiconductor circuit. For instance, the layout system 100 may perform one or more operations to generate a lay out of the semiconductor circuit.

The layout system 100 includes a processor 110, a memory 120, a storage 130, a layout module 140, an input device 150, and an output device 160. The processor 110, the memory 120, the storage 130, the layout module 140, the input device 150, and the output device 160 may be electrically connected via a bus 170 and may thus be able to exchange data with one another. However, the structure of the layout system 100 is not particularly limited, but may vary depending on the purpose of use of the layout system 100. For example, some of the processor 110, the memory 120, the storage 130, the layout module 140, the input device 150, and the output device 160 may not be provided, and the layout system 100 may further include other elements (e.g., a display device) in addition to or different from those elements illustrated in FIG. 1.

The layout module 140 may lay out a semiconductor circuit. The layout module 140 may be implemented as software, hardware, or a combination thereof. In a case where the layout module 140 is implemented as software, the layout module 140 may include one or more instructions for layout out semiconductor circuits. In a case where the layout module 140 is implemented as hardware, the layout module 140 may include, for example, one or more electronic circuits that can be programmed. Alternatively, the layout module 140 may be implemented in part as software and in part as hardware.

The layout module 140 may lay out at least one standard cell design in accordance with a predefined requirement, e.g., a design rule, using the processor 110. The laid-out standard cell design may be stored in the storage 130. The laying out of a semiconductor circuit by the layout module 140 will be described later with reference to FIGS. 3 through 5 and 7 through 11.

The processor 110 controls a general operation of the layout system 100. The processor 110 may lay out a semiconductor circuit by controlling or executing the layout module 140. In some example embodiments, the processor 110 may be implemented as, but not limited to, a central processing unit (CPU), a graphics processing unit (GPU), or the like.

The memory 120 may provide space in which to store instructions, program code, and data for laying out a semiconductor circuit are stored. In some example embodiments, the memory 120 may be implemented as, but not limited to, a nonvolatile memory such as a dynamic random access memory (DRAM) or a static random access memory (SRAM). Alternatively, the memory 120 may be implemented as a nonvolatile memory such as a flash memory.

In a case where the layout module 140 is implemented as a whole or in part as software, the storage 130 may store the instructions or program code of the layout module 140, may store data necessary for laying out a semiconductor circuit, and/or may store layout-related data such as a requirement (e.g., a design rule), data regarding various elements for use in laying out a semiconductor circuit, and standard cell data. The storage 130 may be implemented as, but not limited to, a solid state drive (SSD) or a hard disk drive (HDD). Alternatively, the storage 130 may be implemented as a non-transitory computer-readable medium that can be read by an arbitrary computer.

The layout system 100 may receive layout-related data from, or transmit layout-related data, stored data, and result data to, a user or a device on the inside or the outside of the layout system 100, via the input device 150 or the output device 60.

Figure 2:
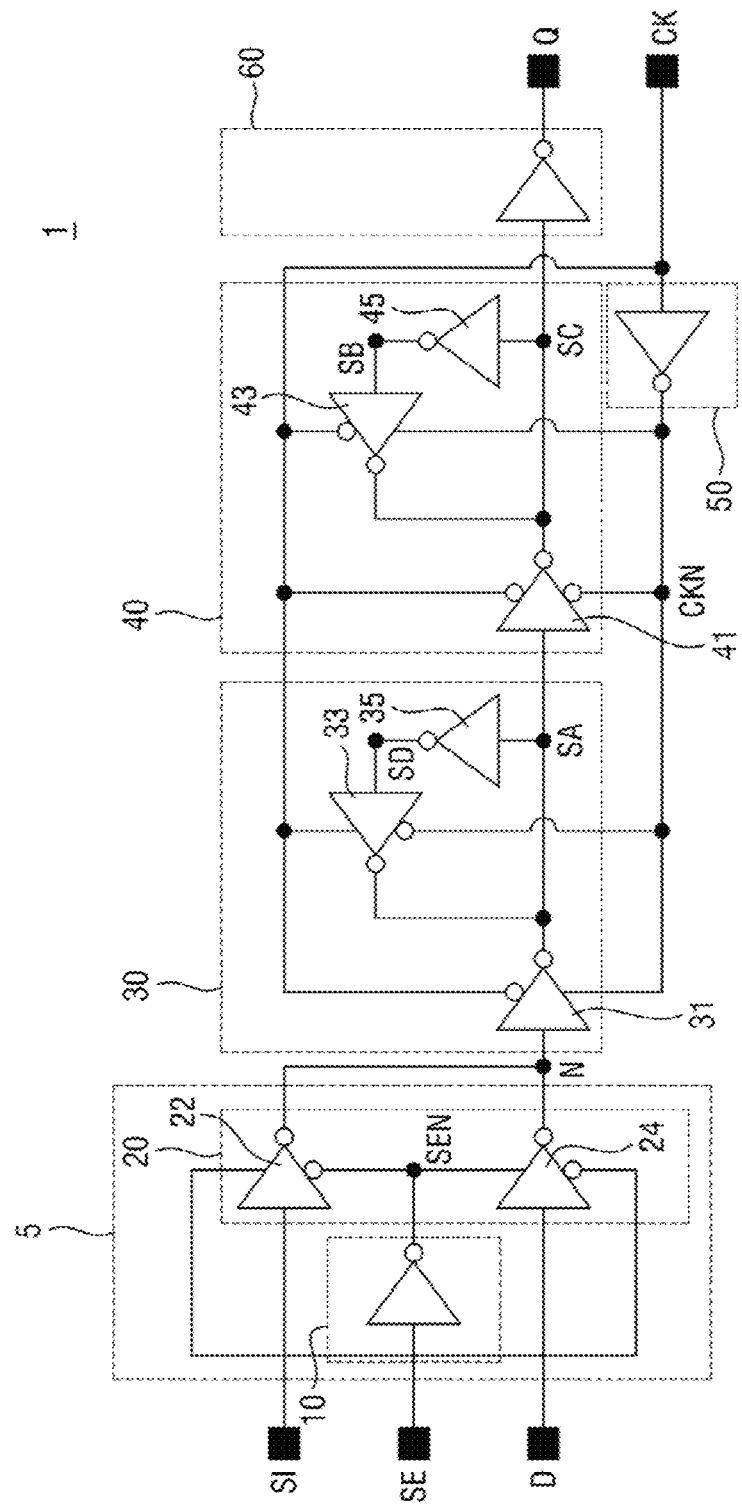
FIG. 2 is a logic circuit diagram of a semiconductor device according to some example embodiments of the disclosure.

FIG. 2 is a logic circuit diagram of a semiconductor device according to some example embodiments of the disclosure. FIGS. 3A through 3E are circuit diagrams of parts of the semiconductor device of FIG. 2.

Referring to FIG. 2, a semiconductor device 1 may include input selection circuit 5, latch circuits 30 and 40, a clock inverter circuit 50, and an output driver circuit 60.

The input selection circuit 5 receives data D or a scan input signal SI for a scan operation to be performed on the semiconductor circuit 1 and provide one of the data D and the scan input signal SI to a node N. Specifically, the input selection circuit 5 includes a scan enable inverter circuit 10 and a multiplexer circuit (or a scan multiplexer circuit) 20.

The scan enable inverter circuit 10 receives a scan enable signal SE, outputs an inverted scan enable signal SEN, which is obtained by inverting the scan enable signal SE, and provides the inverted scan enable signal SEN to the multiplexer 20.

The multiplexer 20 selects one of the data D and the scan input signal SI to the node N in accordance with the value of the inverted scan enable signal SEN provided by the scan enable inverter circuit 10. To this end, the multiplexer 20 may include tri-state inverters 22 and 24. In a case where the scan enable signal SE is logic-high and the inverted scan enable signal SEN is logic-low, the tri-state inverter 22 inverts the scan input signal SI and outputs the inverted scan input signal to the node N. In a case where the scan enable signal SE is logic-low and the inverted scan enable signal SEN is logic-high, the tri-state inverter 24 inverts the data D and outputs the inverted data to the node N.

The clock inverter circuit 50 receives a clock signal CK and outputs an inverted clock signal CKN, which is obtained by inverting the clock signal CK. The clock signal CK and the inverted clock signal CKN may be provided to the latch circuits 30 and 40.

The latch circuit 30 latches the signal at the node N based on the clock signal CK and the inverted clock signal CKN and transmits the latched signal to a node SA. To this end, the latch circuit 30 may include tri-state inverters 31 and 33 and a feedback inverter 35. In a case where the clock signal CK is logic-low and the inverted clock signal CKN is logic-high, the tri-state inverter 31 inverts the signal at the node N and outputs the inverted signal to the node SA. In a case where the clock signal CK is logic-high and the inverted clock signal CKN is logic-low, the tri-state inverter 33 may disconnect the node SA from the node N.

The feedback inverter 35 receives the output signal of the latch circuit 30 via the node SA and feeds back the received signal to the latch circuit 30. Specifically, the feedback inverter 35 feeds back a signal being output to a node SD to the latch circuit 30 by reinverting the output signal of the tri-state inverter 31, applied to the node SA. In a case where the clock signal CK is logic-high and the inverted clock signal CKN is logic-low, i.e., in a case where the node SA is disconnected from the node N, the tri-state inverter 33 inverts the signal provided by the feedback inverter 35 and outputs the inverted signal to the node SA. Accordingly, the signal latched from the node N by the tri-state inverter 31 is uniformly maintained during a period when the clock signal CK is logic-high.

The latch circuit 40 latches the signal at the node SA based on the clock signal CK and the inverted clock signal CKN and transmits the latched signal to a node SC. To this end, the latch circuit 40 may include tri-state inverters 41 and 43 and a feedback inverter 45. In a case where the clock signal CK is logic-high and the inverted clock signal CKN is logic-low, the tri-state inverter 41 inverts the signal at the node NA and outputs the inverted signal to the node SC. In a case where the clock signal CK is logic-low and the inverted clock signal CKN is logic-high, the tri-state inverter 33 may disconnect the node SC from the node SA.

The feedback inverter 45 receives the output signal of the latch circuit 40 via the node SC and feeds back the received signal to the latch circuit 40. Specifically, the feedback inverter 45 feeds back a signal being output to the node SB to the latch circuit 40 by reinverting the output signal of the tri-state inverter 41, applied to the node SA. In a case where the clock signal CK is logic-high and the inverted clock signal CKN is logic-low, i.e., in a case where the node SC is disconnected from the node SA, the tri-state inverter 43 inverts a signal provided by the feedback inverter 45 and outputs the inverted signal to the node SC. Accordingly, the signal latched from the node SA by the tri-state inverter 41 is uniformly maintained during a period when the clock signal CK is logic-low.

That is, at a rising edge of the clock signal CK, the latch circuit 30 serves as a master latch that latches and transmits the signal at the node N to the node SA, and the latch circuit 40 serves as a slave latch that latches and transmits the signal transmitted to the node SA to the node SC.

The output driver circuit 60 receives the output signal of the latch circuit 40 via the node SC and outputs the received signal to the outside as the data D.

In some example embodiments, the feedback inverters 35 and 45 may not be included in the latch circuits 30 and 40, respectively, and may be laid out as separate elements.

Figure 3A:
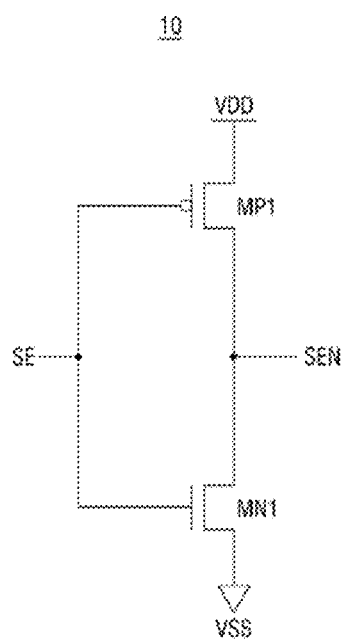
FIGS. 3A through 3E are circuit diagrams of parts of the semiconductor device of FIG. 2.

Referring to FIGS. 2 and 3A, the scan enable inverter circuit 10 may have a P-type transistor MP1 and an N-type transistor MN1 connected in series between a power supply voltage VDD and a ground voltage VSS. In response to the scan enable signal SE being applied to the gates of the P-type transistor MP1 and the N-type transistor MN1, the scan enable inverter circuit 10 may output the inverted scan enable signal SEN via an output node, which is connected to the drain of the P-type transistor MP1.

Figure 3B:
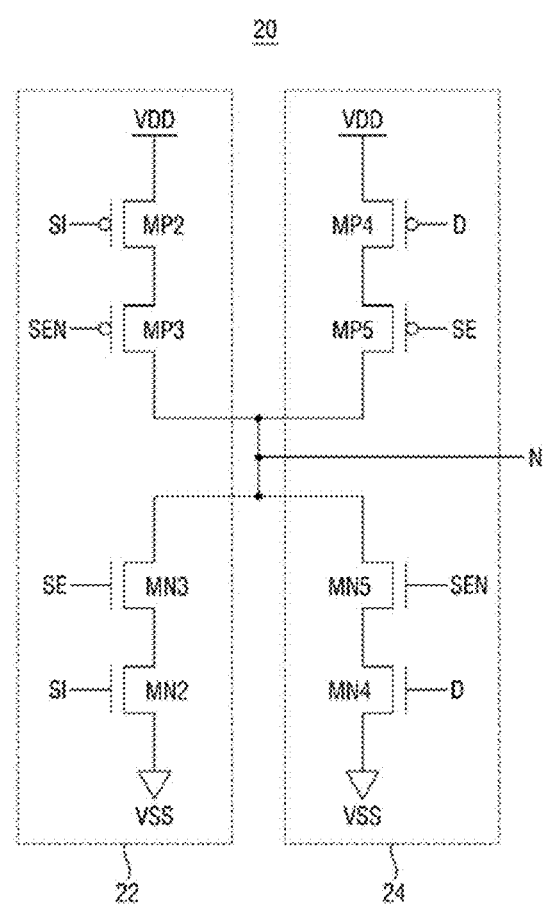

Referring to FIGS. 2 and 3B, the multiplexer circuit 20 includes a plurality of P-type transistors MP2, MP3, MP4, and MP5 and a plurality of N-type transistors MN2, MN3, MN4, and MN5, and the P-type transistors MP2, MP3, MP4, and MP5 and the N-type transistors MN2, MN3, MN4, and MN5 may be connected between the power supply voltage VDD and the ground voltage VSS. The tri-state inverter 22 includes two P-type transistors, i.e., the P-type transistors MP2 and MP3, and two N-type transistors, i.e., the N-type transistors MN2 and MN3. The tri-state inverter 24 includes two P-type transistors, i.e., the P-type transistors MP4 and MP5, and two N-type transistors, i.e., the N-type transistors MN4 and MN5. The multiplexer circuit 20 selectively provides one of the data D and the scan input signal SI to the node N in accordance with the value of the inverted scan enable signal SEN.

Figure 3C:
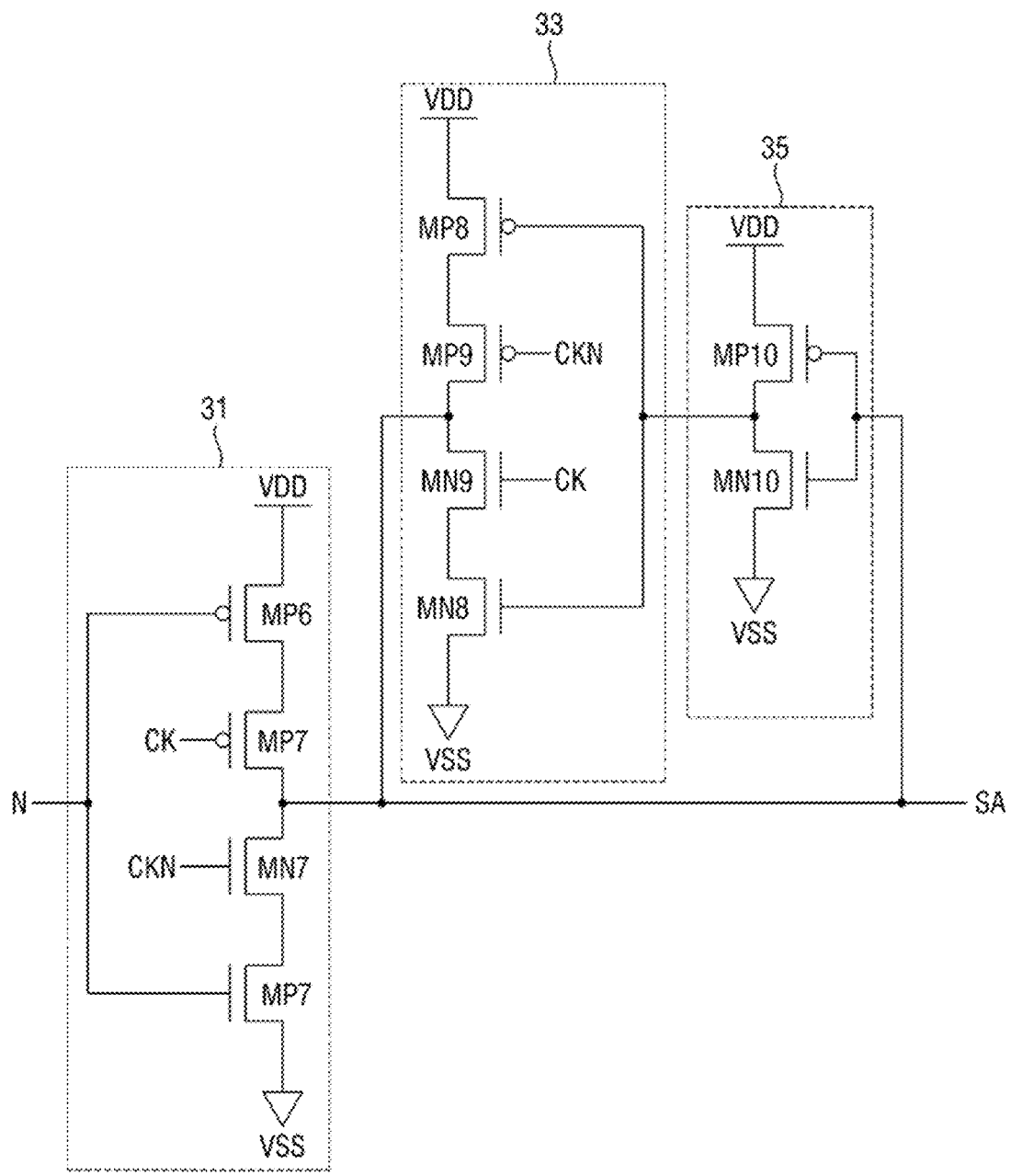

Referring to FIGS. 2 and 3C, the latch circuit 30 includes a plurality of P-type transistors MP6, MP7, MP8, MP9, and MP10 and a plurality of N-type transistors MN6, MN7, MN8, MN9, and MN10. The P-type transistors MP6, MP7, MP8, MP9, and MP10 and the N-type transistors MN6, MN7, MN8, MN9, and MN10 may be connected between the power supply voltage VDD and the ground voltage VSS. The tri-state inverter 31 includes two P-type transistors, i.e., the P-type transistors MP6 and MP7, and two N-type transistors, i.e., the N-type transistors MN6 and MN7. The tri-state inverter 31 inverts the signal at the node N and outputs the inverted signal to the node SA. The tri-state inverter 33 includes two P-type transistors, i.e., the P-type transistors MP8 and MP9, and two N-type transistors, i.e., the N-type transistors MN8 and MN9. The feedback inverter 35 includes the P-type transistor MP10 and the N-type transistor MN10. The tri-state inverter 33 and the feedback inverter 35 are connected in parallel to the output node of the latch circuit 30.

Figure 3D:
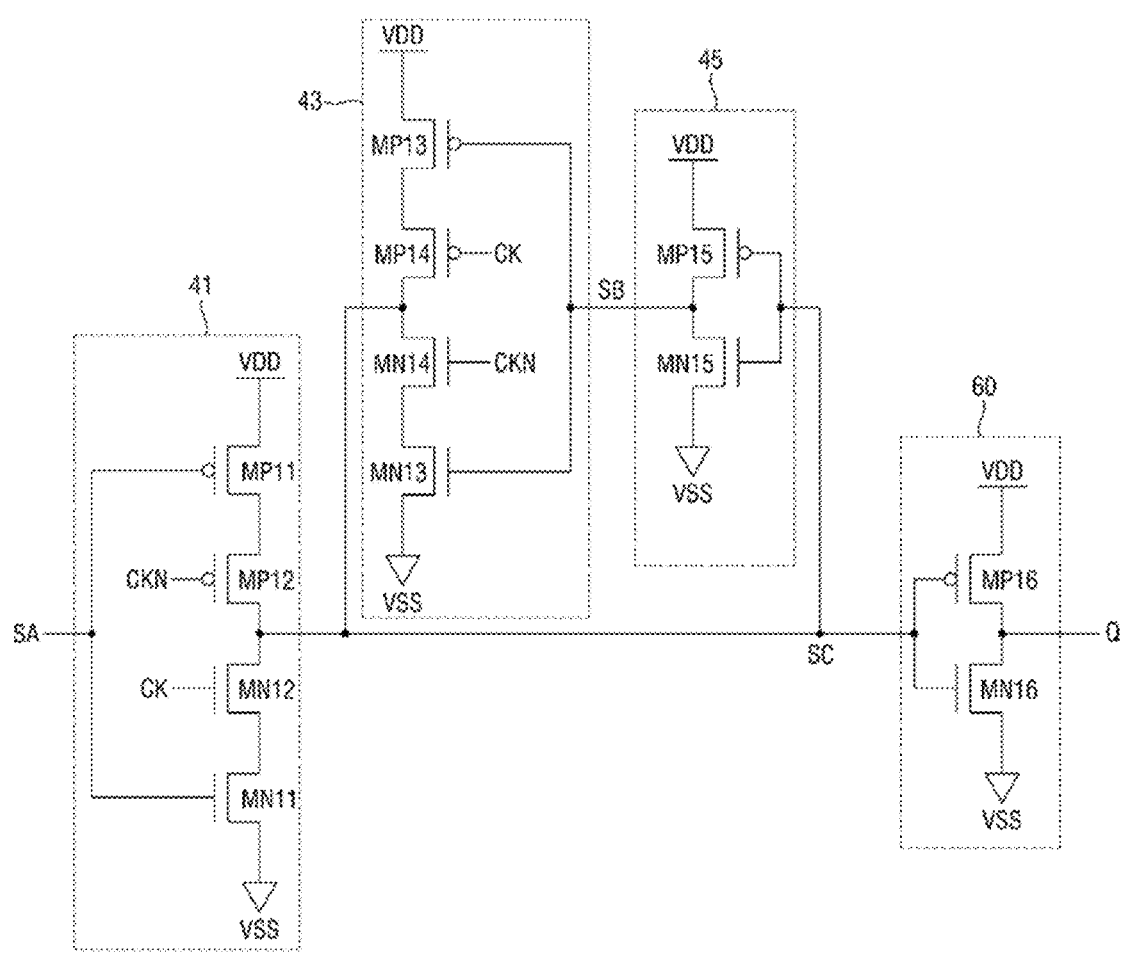

Referring to FIGS. 2 and 3D, the latch circuit 40 includes a plurality of P-type transistors MP11, MP12, MP13, MP14, and MP15 and a plurality of N-type transistors MN11, MN12, MN13, MN14, and MN15. The P-type transistors MP11, MP12, MP13, MP14, and MP15 and the N-type transistors MN11, MN12, MN13, MN14, and MN15 may be connected between the power supply voltage VDD and the ground voltage VSS. The tri-state inverter 41 includes two P-type transistors, i.e., the P-type transistors MP11 and MP12, and two N-type transistors, i.e., the N-type transistors MN11 and MN12, and the two P-type transistors and the two N-type transistors in serial connected between the power supply voltage VDD and the ground voltage VSS. The tri-state inverter 41 receives a signal from the node SA and outputs the operated signal based on the clock signal CK and the inverted clock signal CKN to the node SC. The tri-state inverter 43 includes two P-type transistors, i.e., the P-type transistors MP13 and MP14, and two N-type transistors, i.e., the N-type transistors MN13 and MN14, and the two P-type transistors and the two N-type transistors serially connected between the power supply voltage VDD and the ground voltage VSS. The feedback inverter 45 includes the P-type transistor MP15 and the N-type transistor MN15. The tri-state inverter 43 and the feedback inverter 45 are connected in parallel to the output node of the tri-state inverter 41 i.e., the node SC.

Referring to FIGS. 2 and 3D, the output driver circuit 60 may include two transistors, i.e., a P-type transistor MP16 and an N-type transistor MN16, and may be connected to the output node of the latch circuit 40, i.e., the node SC.

Figure 3E:
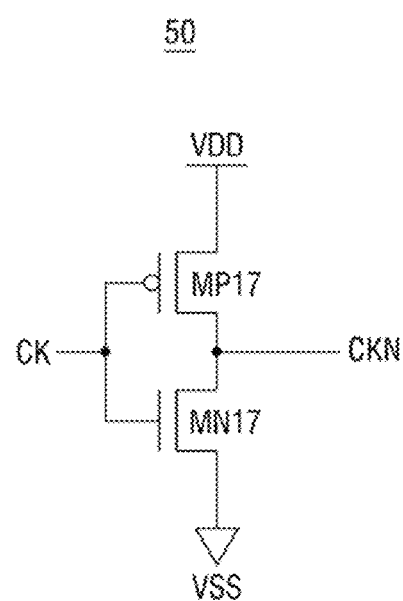

Referring to FIGS. 2 and 3E, the clock inverter circuit 50 may include two transistors, i.e., a P-type transistor MP17 and an N-type transistor MN17. The clock inverter circuit 50 receives the clock signal CK via the gates of the P- and N-type transistors MP17 and MN17 and outputs the inverted clock signal CKN via its output node to which the drain of the P-type transistor MP17 and the source of the N-type transistor MN17 are connected.

That is, referring to FIGS. 3A through 3E, the latch circuits 30 and 40 and the clock inverter circuits 50 have in common that they are all based on the clock signal CK or the inverted clock signal CKN. The number and the coupling capacitance of wiring lines for applying the clock signal CK or the inverted clock signal CKN may considerably affect the number of processes for forming the semiconductor device 1 and the operating efficiency of the semiconductor device 1. If paths that are routed to wiring lines in a standard cell structure are elongated, the length of wiring lines for routing and the number of metal layers may increase unnecessarily, and as a result, the power consumption of functional circuits may increase due to indirect factors such as parasitic resistance or parasitic capacitance. Accordingly, a semiconductor device 1 that complies with the design rule of a circuit layout and can reduce the power consumption of functional circuits can be provided.

Figure 4:
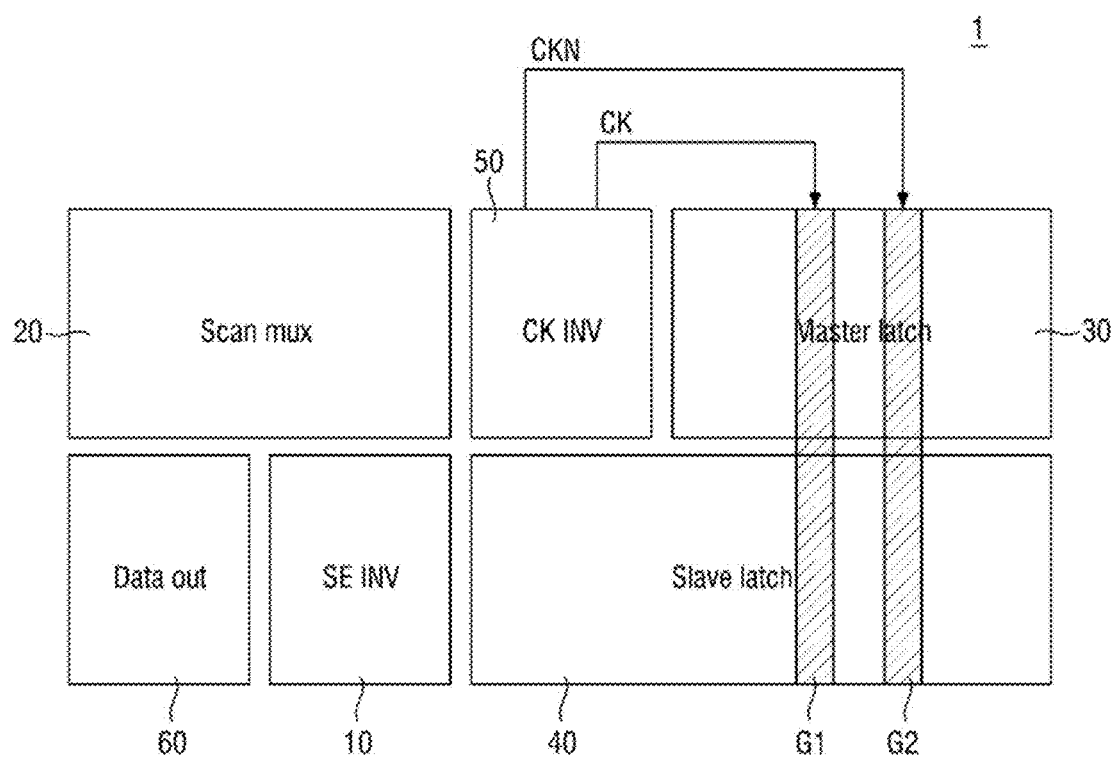
FIGS. 4 through 6 are views illustrating the layout of the semiconductor device according to some example embodiments of the disclosure.
Figure 5:
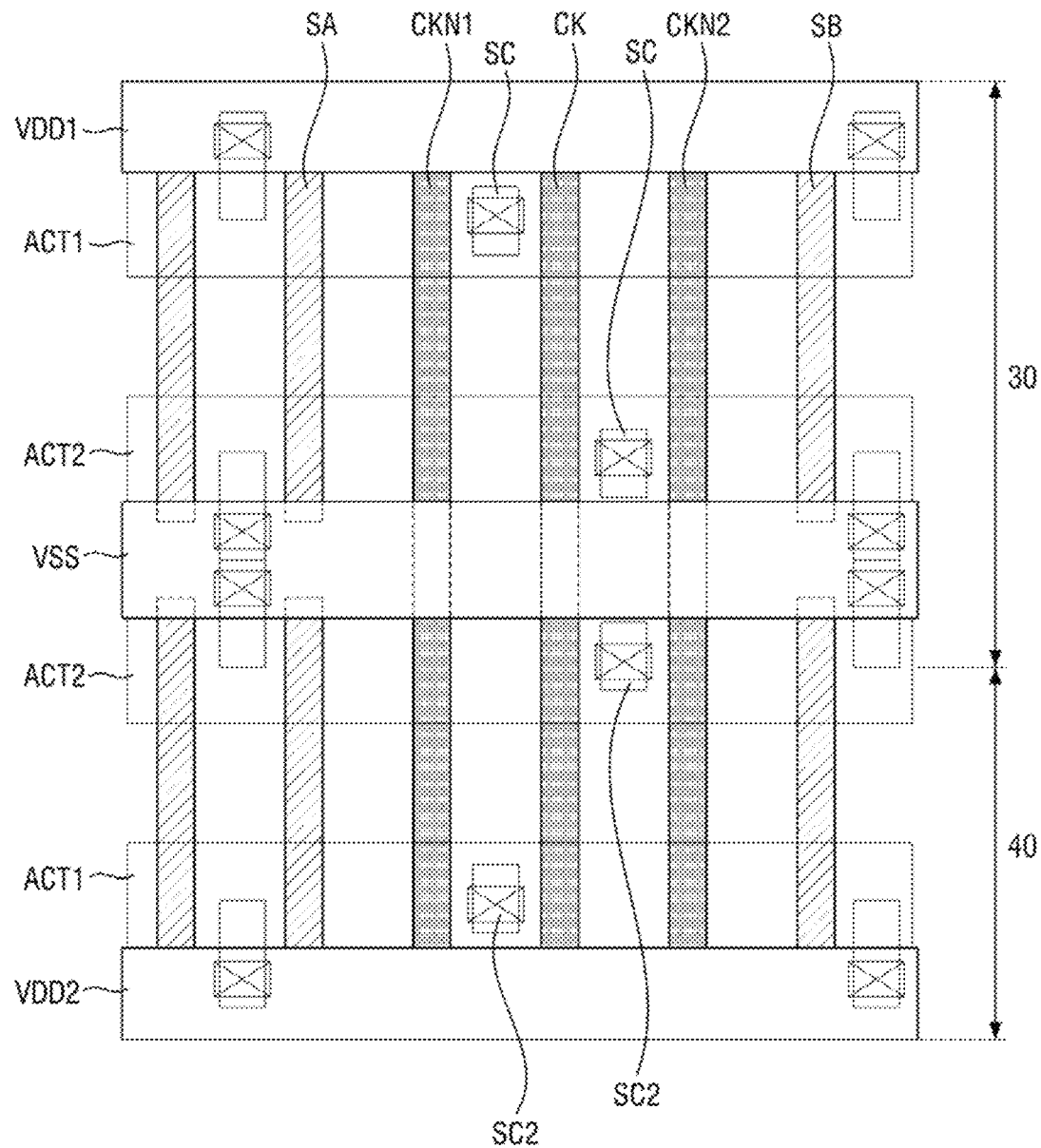
Figure 6:
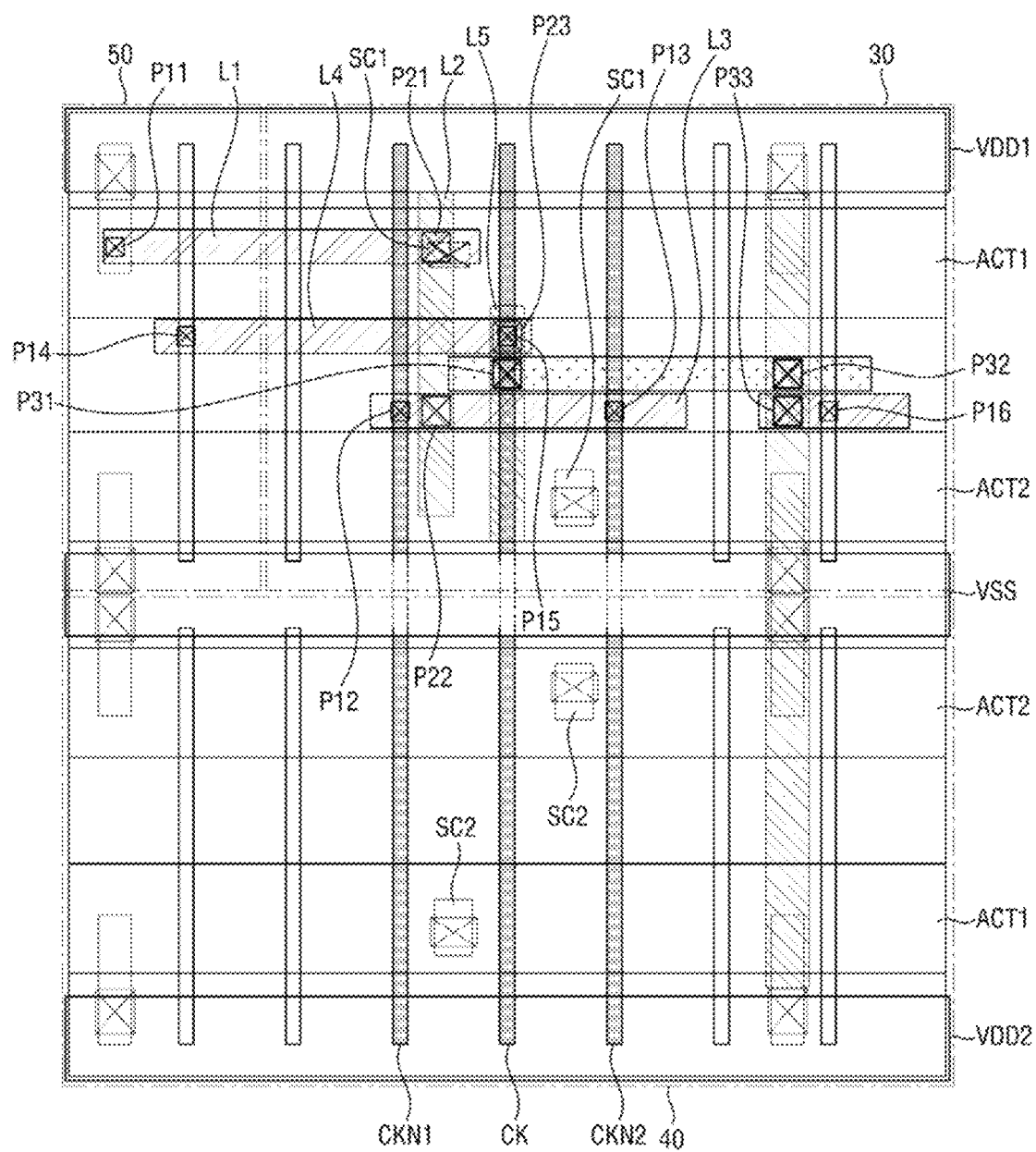

FIGS. 4 through 6 are views illustrating the layout of the semiconductor device according to some example embodiments of the disclosure.

Referring to FIG. 4, the semiconductor device 1 may include a plurality of functional circuits. In some example embodiments, in the layout of the semiconductor device 1, the functional circuits may have a rectangular shape and may be arranged in a plurality of columns or a plurality of rows. In some example embodiments, in a case where the functional circuits are arranged in a plurality of rows, the functional circuits may share gate lines to which input signals are applied in common. In some example embodiments, in a case where the functional circuits are arranged in a plurality of columns, the functional circuits may share wiring lines to which common signals are applied. Once gate lines or wiring lines are shared between the functional circuits for common signals, unnecessary use of wiring in a standard cell layout can be reduced, and as a result, the number of metal layers can be reduced, which may be highly beneficial in terms of response speed to signals and the operation performance of parasitic components.

In some example embodiments, the functional circuits may include the input selection circuits (10 and 20), the latch circuits 30 and 40, the clock inverter circuit 50, and the output driver circuit 60.

The functional circuits are illustrated as being arranged in two rows, but the disclosure is not limited thereto. That is, alternatively, the functional circuits may be arranged in more than two rows or in multiple columns or may be stacked in multiple layers.

The multiplexer circuit 20, the clock inverter circuit 50, and the latch circuit 30 may be arranged in a first row (in a direction D1), and the output driver circuit 50, the scan enable inverter circuit 10, and the latch circuit 40 may be arranged in a second row (in the direction D1). The latch circuits 30 and 40 may have the clock signal CK and the inverted clock signal CKN in common as input signals.

Referring to FIGS. 2, 3D, 4, 5, and 6, the latch circuit 30 receives its input via the node N and outputs its output signal to the node SA, and the latch circuit 40 outputs the signal input to the node SA to the nodes SB and SC. The clock signal CK and the inverted clock signal CKN are applied in common to the latch circuits 30 and 40 as input signals.

In a standard cell structure according to some example embodiments of the disclosure, gate lines are arranged at intervals of a predetermined distance. In the layout of the semiconductor device 1, if one of the gate lines are a clock gate line G1 and an inverted clock gate line G2, the latch circuits 30 and 40 may be disposed adjacent to each other to share the clock gate line G1 and the inverted clock gate line G2. The clock gate line G1 and the inverted clock gate line G2 may be disposed a predetermined distance apart from each other in the direction D1 to extend in a direction D2 in parallel with each other. The latch circuits 30 and 40 may be arranged such that the lower side, in the direction D2, of the latch circuit 30 may adjoin the upper side, in the direction D2, of the latch circuit 40.

Referring to FIG. 4, the clock inverter circuit 50 may be disposed on one side, in the direction D1, of the latch circuit 30, and the multiplexer circuit 20 may be disposed on the other side, in the direction D1, of the latch circuit 30. The output driver circuit 60 and the scan enable inverter circuit 10 may be disposed to adjoin the lower side, in the direction D2, of the multiplexer circuit 20. The scan enable inverter circuit 10 may be arranged such that one side, in the direction D1, of the scan enable inverter circuit 10 may adjoin the output driver circuit 60 and the other side, in the direction D1, of the scan enable inverter circuit 10 may adjoin the latch circuit 40. The sum of the length, in the direction D1, of the clock inverter circuit 50 and the length, in the direction D1, of the latch circuit 30 may be the same as the length, in the direction D1, of the latch circuit 40.

The clock inverter circuit 50 receives the clock signal CK and generates the inverted clock signal CKN. Only one, or more than one, clock gate line G1 and only one, or more than one, inverted clock gate line G2 may be provided depending on the layout of the semiconductor device 1.

In the embodiment of FIGS. 5 and 6, layouts that includes one clock gate line CK and two inverted clock gate lines CKN1 and CKN2 are provided, but the disclosure is not limited thereto. Moreover, the layouts in FIGS. 5 and 6 may further include power lines VDD1, VSS, VDD2, and active areas ACT1 and ACT2.

Referring to FIG. 6, the inverted clock signal CKN is output from the output node of the clock inverter circuit 50 to the latch circuits 30 and 40. The inverted clock gate lines CKN1 and CKN2 are connected to the output node of the clock inverter circuit 50 through wiring lines L1, L2, and L3. The wiring line L1 is connected to the drain of the P-type transistor MP17, which is the output node of the clock inverter circuit 50, throught a via P11 and extends in the direction D1. The wiring line L2 extends in the direction D2 and is connected to the wiring line L1 through a via P21. The wiring line L3 extends in the direction D1 and is connected to the wiring line L2 through a via P22. The inverted clock gate line CKN1 is connected to the wiring line L3 through a via P12. The inverted clock gate line CKN2 is connected to the wiring line L3 through a via P13.

The clock signal CK is output from the input node of the clock inverter circuit 50 to the latch circuits 30 and 40. The clock gate line CK of the latch circuits 30 and 40 is connected to the input node of the clock inverter circuit 50 through a wiring line L4. The wiring line L4 is connected to the gate of the transistor MP17, which is the input node of the clock inverter circuit 50, through a via P14 and extends in the direction D1. The clock gate line CK of the latch circuits 30 and 40 is connected to the wiring line L4 through a via P15.

That is, the clock gate line CK and the inverted clock gate lines CKN1 and CKN2 extend in the direction D2 without being disconnected by a power rail VSS and may thus be shared by the latch circuits 30 and 40. Accordingly, wiring lines for supplying the clock signal CK in the semiconductor device 1 can be routed in a distributed manner in the directions D1 and D2, instead of being elongated in a particular direction. Thus, parasitic resistance and load capacitance can be prevented from increasing due to wiring lines in a particular layer excessively being elongated, and power consumption can be reduced accordingly.

The clock signal CK may be provided to functional circuits adjacent to the latch circuits 30 and 40. In this case, an additional clock gate line may be provided so that the clock gate line CK on one side, in the direction D2, of the latch circuit 40 may not be shared. For example, a wiring line L5 is connected to the clock gate line CK through a via P23 and extends in the direction D2, a wiring line L6 is connected to the wiring line L5 through a via P31 and extends in the direction D1, a wiring line L7 is connected to the wiring line L6 through a via P32 and extends in the direction D2, and a wiring line L8 is connected to the wiring line L7 through a via P33 and extends in the direction D1. The additional clock gate line may be connected to the wiring line L8 through a via P16.

The wiring lines L1, L3, L4, and L8 may be disposed in parallel in a first metal layer not to overlap with one another, and the wiring lines L2, L5, and L7 may be disposed in a second metal layer in parallel not to overlap with one another. The wiring line L6 may be disposed in a third metal layer. The first, second, and third metal layers are different metal layers.

FIGS. 7 through 22 are views illustrating the layouts of semiconductor devices according to some example embodiments of the disclosure. In each of the example embodiments of FIGS. 7 through 22, the functional circuits of a semiconductor device 1 may be arranged in a plurality of rows or a plurality of columns, and functional circuits that need common signal input may be disposed adjacent to one another and share wiring lines (e.g., gate lines) to which common signals are applied. The example embodiments of FIGS. 7 through 22 will hereinafter be described, focusing mainly on the differences with the embodiment of FIGS. 1 through 6.

In each of the example embodiments of FIGS. 7 through 11, the sum of the length, in a direction D1, of a clock inverter circuit 50 and the length, in the direction D1, of a latch circuit 30 may be the same as the length, in the direction D1, of a latch circuit 40. The arrangement of a scan enable inverter circuit 10, a multiplexer circuit 20, and an output driver circuit 60 may vary depending on how the clock inverter circuit 50 and the latch circuits 30 and 40 are arranged.

Figure 7:
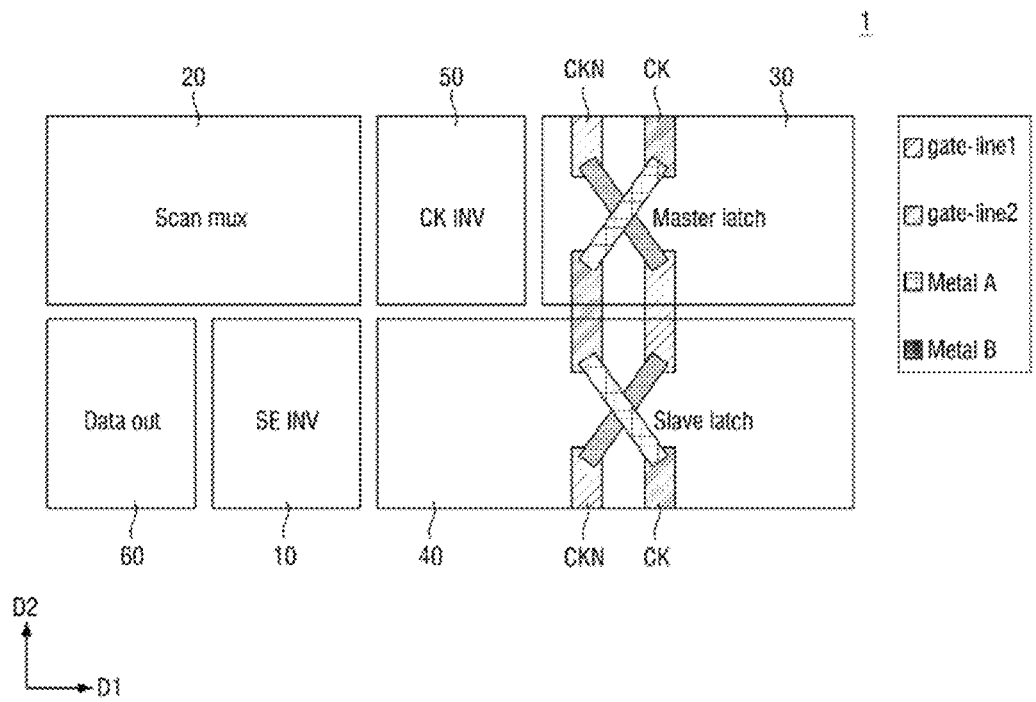
FIGS. 7 through 22 are views illustrating the layouts of semiconductor devices according to some example embodiments of the disclosure.

In the layout of a semiconductor device 1 of FIG. 7, a multiplexer circuit 20, a clock inverter circuit 50, and a latch circuit 30 may be arranged in a first row, and an output driver circuit 60, a scan enable inverter circuit 20, and a latch circuit 40 may be arranged in a second row. The functional circuits of the semiconductor device 1 of FIG. 7 may be disposed in the first and second rows to adjoin a power rail to which power is applied. The latch circuits 30 and 40 may be disposed to at least partially adjoin each other in the direction D1, and gate lines to which common signals are applied may be disposed in a direction D2 to extend across sides of the latch circuits 30 and 40 that adjoin each other.

In the embodiment of FIG. 7, unlike in the embodiment of FIG. 4, the gate lines may be disconnected in each functional circuit. The gate lines may be disconnected not near the power rail, but in the middle of each functional circuit, and may extend in the direction D2 across the power rail, without being disconnected, and may be connected via wiring lines in areas other than an active area ACT.

For example, a clock gate line CK and an inverted clock gate line CKN may include a plurality of clock sub-gate lines and a plurality of inverted clock sub-gate lines, respectively. The clock sub-gate lines and the inverted clock sub-gate lines may be disposed to extend in parallel in the direction D2 and may be alternately arranged to be spaced apart from one another. Sub-gate lines that provide the same signal may be connected to one another by additional wiring lines "Metal A" or "Metal B".

In some example embodiments, the clock gate line CK may include a first clock sub-gate line in a second column "gate-line2", a second clock sub-gate line in a first column "gate-line1", and a third clock sub-gate line in the second column "gate-line2".

The first and second clock sub-gate lines may be connected by at least one wiring line "Metal A", which may be a wiring line formed at a predetermined inclination or may consist of two or more wiring lines that extend in the direction D1 or D2 to be stacked and connected together. The second and third clock sub-gate lines may be connected by at least one wiring line "Metal A", which may be a wiring line formed at a predetermined inclination or may consist of two or more wiring lines that extend in the direction D1 or D2 to be stacked and connected together.

In some example embodiments, the inverted clock gate line CKN may include a first inverted clock sub-gate line in the first column "gate-line1", a second inverted clock sub-gate line in the second column "gate-line2", and a third inverted clock sub-gate line in the first column "gate-line1".

The first and second inverted clock sub-gate lines may be connected by at least one wiring line "Metal B", which may be a wiring line formed at a predetermined inclination or may consist of two or more wiring lines that extend in the direction D1 or D2 to be stacked and connected together. The second and third inverted clock sub-gate lines may be connected by at least one wiring line "Metal B", which may be a wiring line formed at a predetermined inclination or may consist of two or more wiring lines that extend in the direction D1 or D2 to be stacked and connected together.

The wiring lines "Metal A" and the wiring lines "Metal B" may be disposed in different metal layers.

Figure 8:
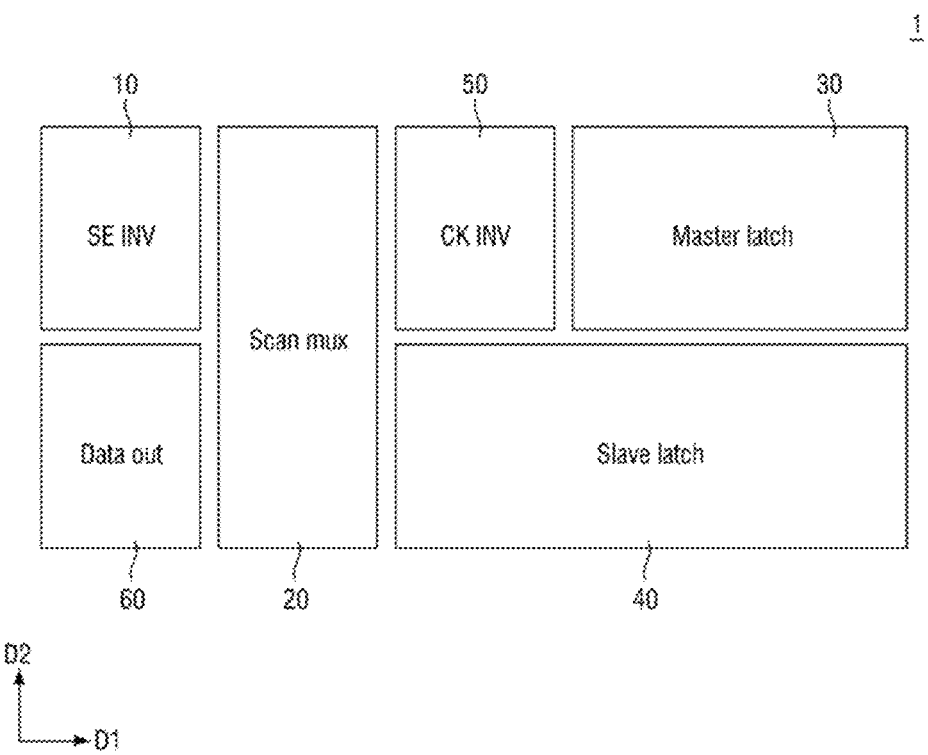

In the layout of a semiconductor device 1 of FIG. 8, a scan enable inverter circuit 10, a clock inverter circuit 50, and a latch circuit 30 may be disposed in a first row, a multiplexer circuit 20 may be disposed across the first row and a second row, between the scan enable inverter circuit 10 and the clock inverter circuit 50, and an output driver circuit, part of the multiplexer circuit 20, and a latch circuit 40 may be disposed in the second row.

The functional circuits of the semiconductor device 1 of FIG. 8 may be disposed in the first and second rows to adjoin a power rail to which power is applied. The latch circuits 30 and 40 may be disposed to at least partially adjoin each other in the direction D1, and gate lines to which common signals are applied may be disposed in the direction D2 to extend across sides of the latch circuits 30 and 40 that adjoin each other.

Figure 9:
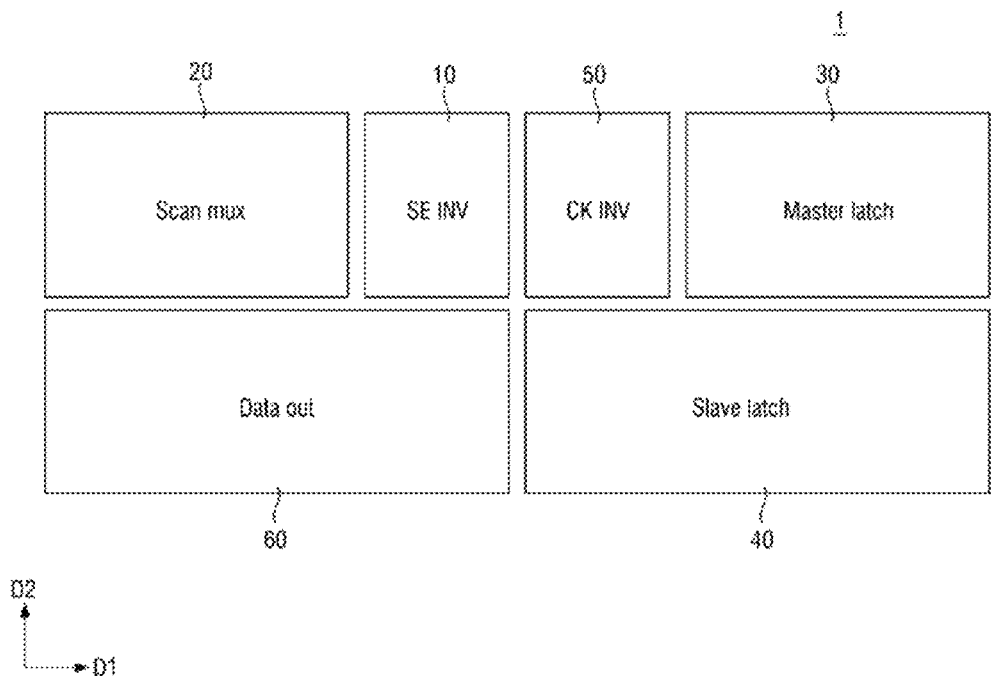

In the layout of a semiconductor device 1 of FIG. 9, a multiplexer circuit 20, a scan enable inverter circuit 10, a clock inverter circuit 50, and a latch circuit 30 may be sequentially arranged in a direction D1 in a first row, and an output driver circuit 60 and a latch circuit 40 may be sequentially arranged in the direction D1 in a second row. The latch circuits 30 and 40 may be disposed to at least partially adjoin each other in the direction D1, and gate lines to which common signals are applied may be disposed in a direction D2 to extend across sides of the latch circuits 30 and 40 that adjoin each other.

Figure 10:
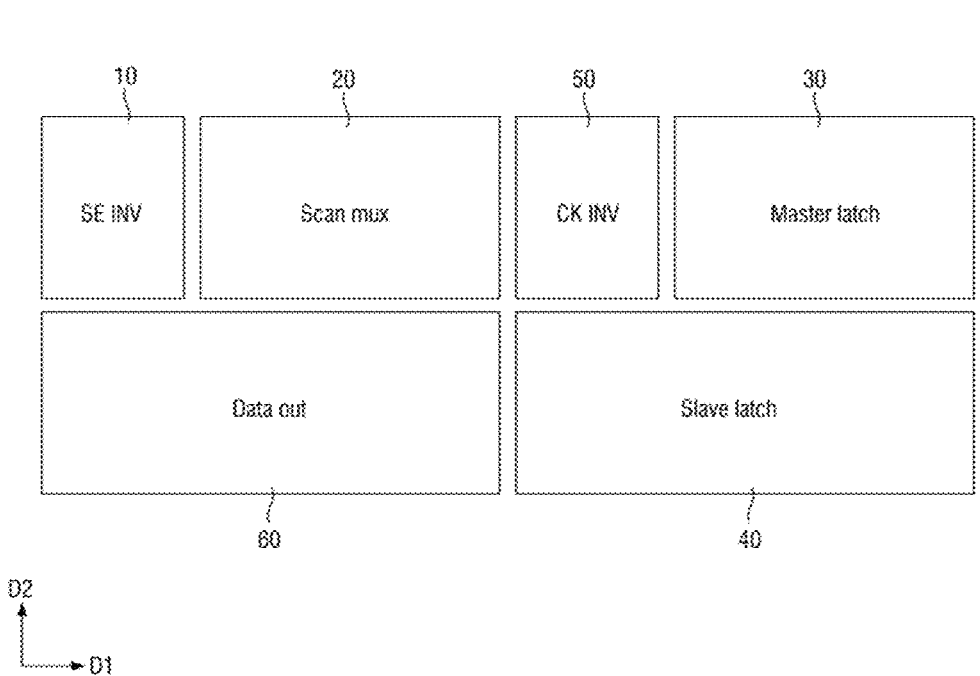

In the layout of a semiconductor device 1 of FIG. 10, a scan enable inverter circuit 10, a multiplexer circuit 20, a clock inverter circuit 50, and a latch circuit 30 may be sequentially arranged in a direction D1 in a first row, and an output driver circuit 60 and a latch circuit 40 may be sequentially arranged in the direction D1 in a second row. The latch circuits 30 and 40 may be disposed to at least partially adjoin each other in the direction D1, and gate lines to which common signals are applied may be disposed in a direction D2 to extend across sides of the latch circuits 30 and 40 that adjoin each other.

Figure 11:
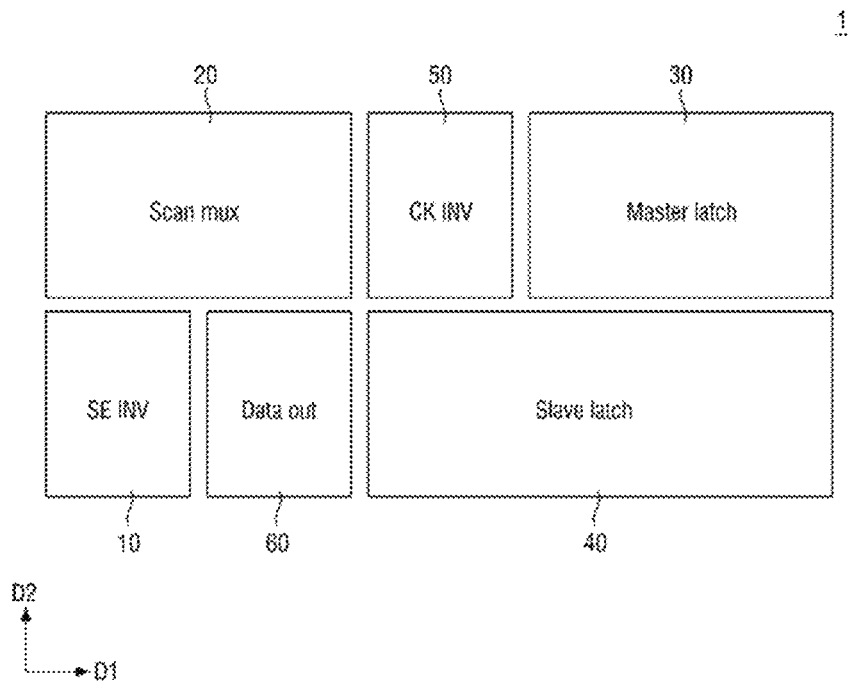

In the layout of a semiconductor device 1 of FIG. 11, a multiplexer circuit 20, a clock inverter circuit 50, and a latch circuit 30 may be sequentially arranged in a direction D1 in a first row, and a scan enable inverter circuit 10, an output driver circuit 60, and a latch circuit 40 may be sequentially arranged in the direction D1 in a second row. The latch circuits 30 and 40 may be disposed to at least partially adjoin each other in the direction D1, and gate lines to which common signals are applied may be disposed in a direction D2 to extend across sides of the latch circuits 30 and 40 that adjoin each other.

Figure 12:
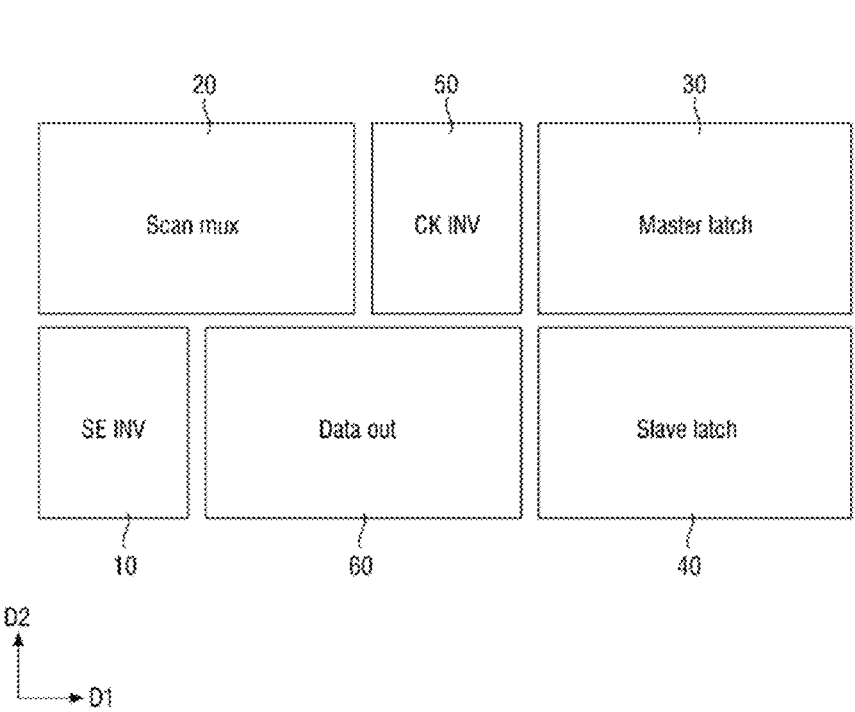
Figure 13:
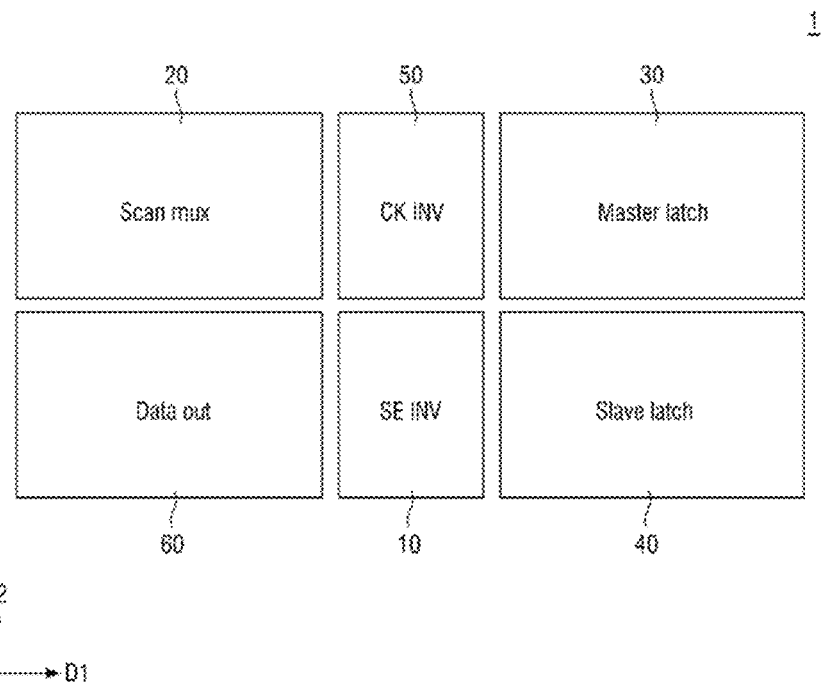

In each of the example embodiments of FIGS. 12 and 13, the length, in a direction D1, of a latch circuit 30 may be the same as the length, in the direction D1, of a latch circuit 40. The arrangement of a scan enable inverter circuit 10, a multiplexer circuit 20, and an output driver circuit 60 may vary depending on how the latch circuits 30 and 40 are arranged.

In the layout of a semiconductor device 1 of FIG. 12, a multiplexer circuit 20, a clock inverter circuit 50, and a latch circuit 30 may be sequentially arranged in a direction D1 in a first row, and a scan enable inverter circuit 10, an output driver circuit 60, and a latch circuit 40 may be sequentially arranged in the direction D1 in a second row. The sum of the lengths, in the direction D1, of the multiplexer circuit 20 and the clock inverter circuit 50 may be the same as the sum of the lengths, in the direction D1, of the scan enable inverter circuit 10 and the output driver circuit 60.

In the layout of a semiconductor device 1 of FIG. 13, a multiplexer circuit 20, a clock inverter circuit 50, and a latch circuit 30 may be sequentially arranged in a direction D1 in a first row, and a scan enable inverter circuit 10, an output driver circuit 60, and a latch circuit 40 may be sequentially arranged in the direction D1 in a second row. The length, in the direction D1, of the multiplexer circuit 20 may be the same as the length, in the direction D1, of the output driver circuit 60, and the length, in the direction D1, of the clock inverter circuit 50 and the length, in the direction D1, of the scan enable inverter circuit 10.

In each of the example embodiments of FIGS. 14 through 20, the layout of a semiconductor device 1 may include a multiplexer circuit 20 that is disposed across first and second rows and is bent in an L shape. For convenience, part of the multiplexer 20 in the first row will hereinafter be described as an upper part, and part of the multiplexer 20 in the second row will hereinafter be described as a lower part.

Figure 14:
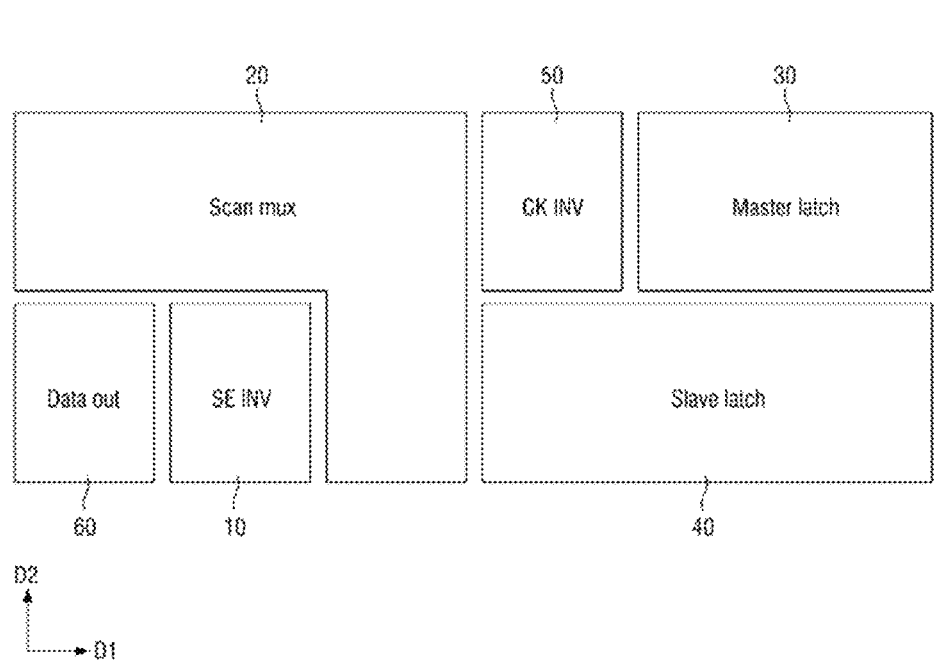

In the layout of a semiconductor device 1 of FIG. 14, an upper part of a multiplexer circuit 20, a clock inverter circuit 50, and a latch circuit 30 may be disposed in a first row, and an output driver circuit 60, a scan enable inverter circuit 10, a lower part of the multiplexer circuit 20, and a latch circuit 40 may be disposed in a second row. The length, in a direction D1, of the upper part of the multiplexer circuit 20 may be the same as the sum of the lengths, in the direction D1, of the output driver circuit 60, the scan enable inverter circuit 10, and the lower part of the multiplexer circuit 20. The sum of the lengths, in the direction D1, of the clock inverter circuit 50 and the latch circuit 30 may be the same as the length, in the direction D1, of the latch circuit 40.

Figure 15:
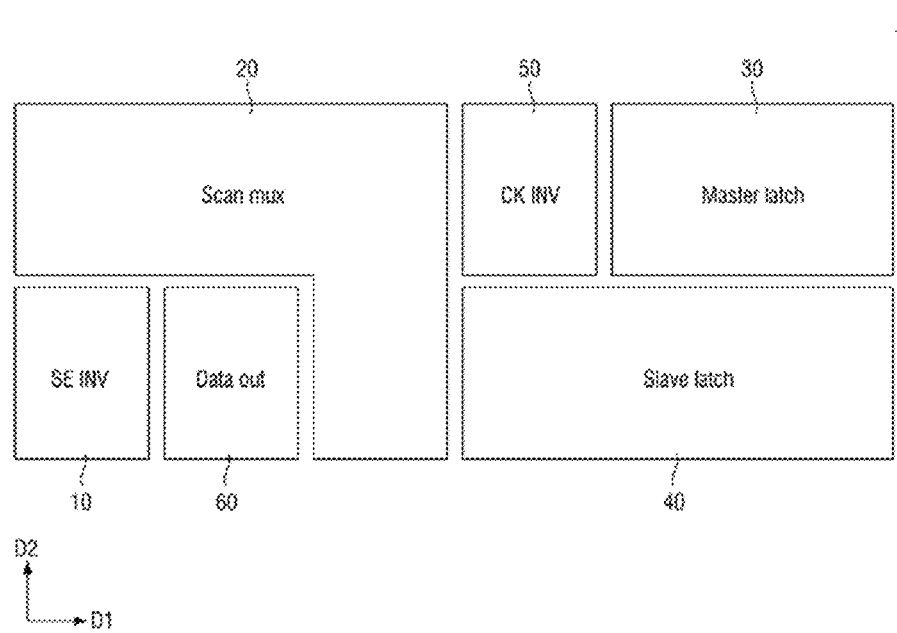

In the layout of a semiconductor device 1 of FIG. 15, an upper part of a multiplexer circuit 20, a clock inverter circuit 50, and a latch circuit 30 may be disposed in a first row, and a scan enable inverter circuit 10, an output driver circuit 60, a lower part of the multiplexer circuit 20, and a latch circuit 40 may be disposed in a second row. The length, in a direction D1, of the upper part of the multiplexer circuit 20 may be the same as the sum of the lengths, in the direction D1, of the scan enable inverter circuit 10, the output driver circuit 60, and the lower part of the multiplexer circuit 20. The sum of the lengths, in the direction D1, of the clock inverter circuit 50 and the latch circuit 30 may be the same as the length, in the direction D1, of the latch circuit 40.

Figure 16:
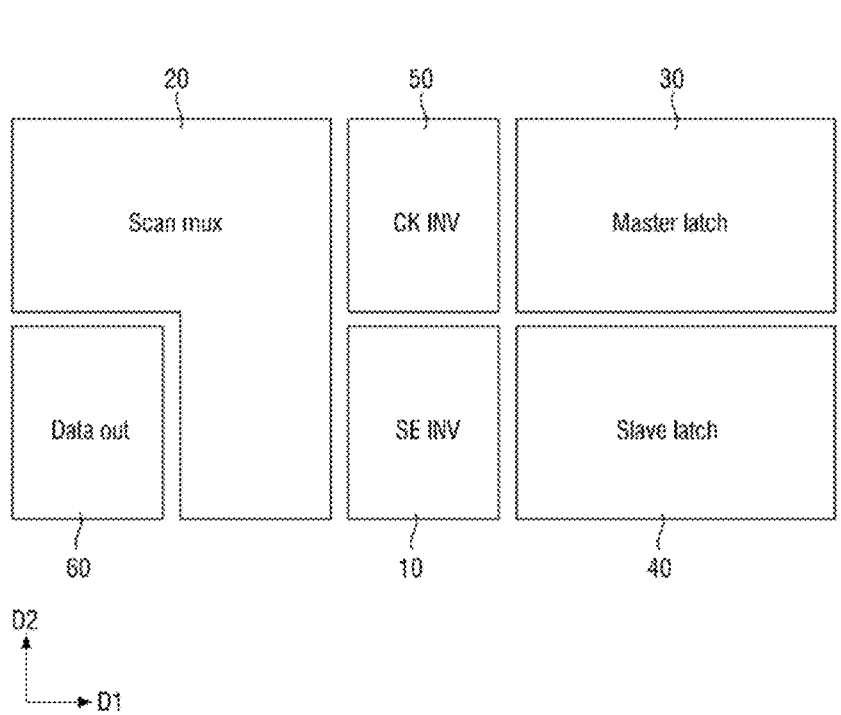

In the layout of a semiconductor device 1 of FIG. 16, an upper part of a multiplexer circuit 20, a clock inverter circuit 50, and a latch circuit 30 may be disposed in a first row, and an output driver circuit 60, a lower part of the multiplexer circuit 20, a scan enable inverter circuit 10, and a latch circuit 40 may be disposed in a second row. The length, in a direction D1, of the latch circuit 30 may be the same as the length, in the direction D1, of the latch circuit 40. The length, in the direction D1, of the clock inverter circuit 50 may be the same as the length, in the direction D1, of the scan enable inverter circuit 10. The length, in the direction D1, of the upper part of the multiplexer circuit 20 may be the same as the sum of the lengths, in the direction D1, of the output driver circuit 60 and the lower part of the multiplexer circuit 20.

Figure 17:
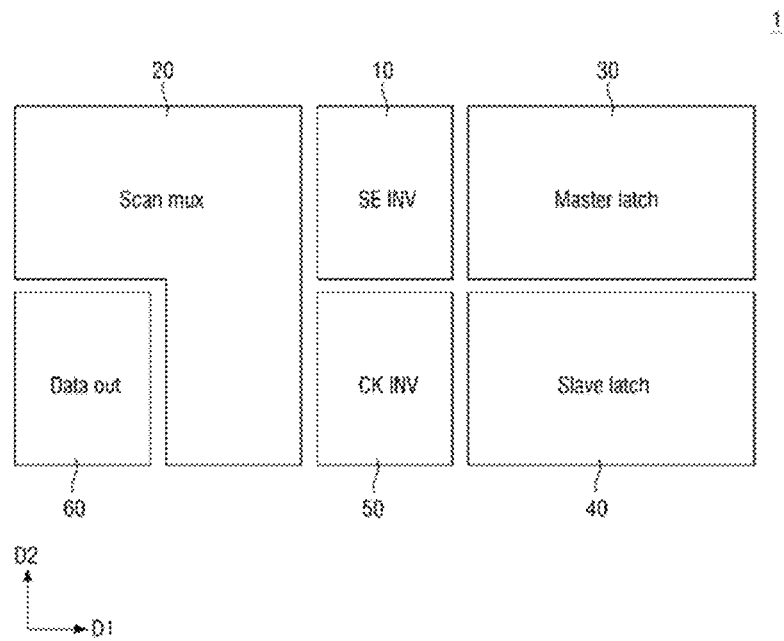

In the layout of a semiconductor device 1 of FIG. 17, an upper part of a multiplexer circuit 20, a scan enable inverter circuit 10, and a latch circuit 30 may be disposed in a first row, and an output driver circuit 60, a lower part of the multiplexer circuit 20, a clock inverter circuit 50, and a latch circuit 40 may be disposed in a second row. The length, in a direction D1, of the latch circuit 30 may be the same as the length, in the direction D1, of the latch circuit 40. The length, in the direction D1, of the clock inverter circuit 50 may be the same as the length, in the direction D1, of the scan enable inverter circuit 10. The length, in the direction D1, of the upper part of the multiplexer circuit 20 may be the same as the sum of the lengths, in the direction D1, of the output driver circuit 60 and the lower part of the multiplexer circuit 20.

Figure 18:
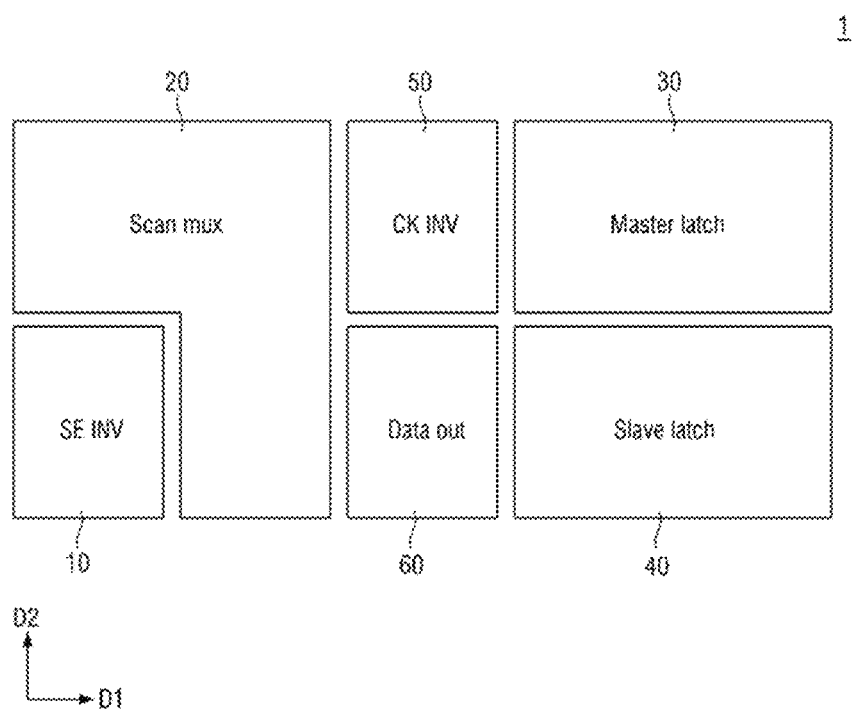

In the layout of a semiconductor device 1 of FIG. 18, an upper part of a multiplexer circuit 20, a clock inverter circuit 50, and a latch circuit 30 may be disposed in a first row, and a scan enable inverter circuit 10, a lower part of the multiplexer circuit 20, an output driver circuit 60, and a latch circuit 40 may be disposed in a second row. The length, in a direction D1, of the latch circuit 30 may be the same as the length, in the direction D1, of the latch circuit 40. The length, in the direction D1, of the clock inverter circuit 50 may be the same as the length, in the direction D1, of the scan enable inverter circuit 10. The length, in the direction D1, of the upper part of the multiplexer circuit 20 may be the same as the sum of the lengths, in the direction D1, of the scan enable inverter 10 and the lower part of the multiplexer circuit 20.

In each of the example embodiments of FIGS. 19 through 22, latch circuits 30 and 40 may include inverter circuits 35 and 45, respectively. The inverter circuits 35 and 45 may be the same as, or different from, their respective counterparts of FIG. 2. The inverter circuits 35 and 45 may be disposed in the same rows as the latch circuits 30 and 40, respectively, to adjoin the latch circuits 30 and 40, respectively.

Figure 19:
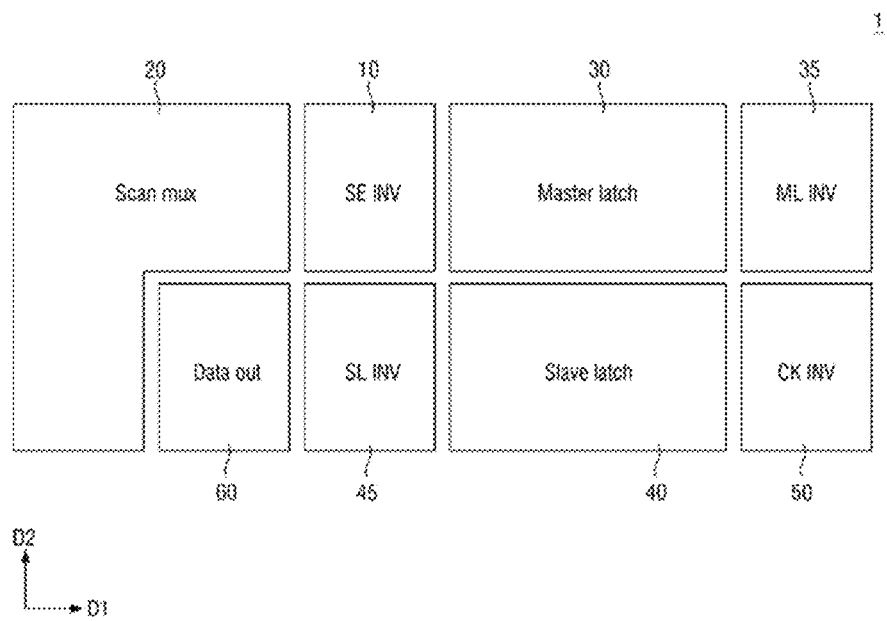

In the layout of a semiconductor device 1 of FIG. 19, an upper part of a multiplexer circuit 20, a scan enable inverter circuit 10, a latch circuit 30, and an inverter circuit 35 may be disposed in a first row, and a lower part of the multiplexer circuit 20, an output driver circuit 60, an inverter circuit 45, a latch circuit 40, and a clock inverter circuit 50 may be disposed in a second row. The length, in a direction D1, of the latch circuit 30 may be the same as the length, in the direction D1, of the latch circuit 40. The length, in the direction D1, of the inverter circuit 35 may be the same as the length, in the direction D1, of the clock inverter circuit 50. The length, in the direction D1, of the scan enable inverter circuit 10 may be the same as the length, in the direction D1, of the inverter circuit 45. The length, in the direction D1, of the upper part of the multiplexer circuit 20 may be the same as the sum of the lengths, in the direction D1, of the output driver circuit 60 and the lower part of the multiplexer circuit 20.

Figure 20:
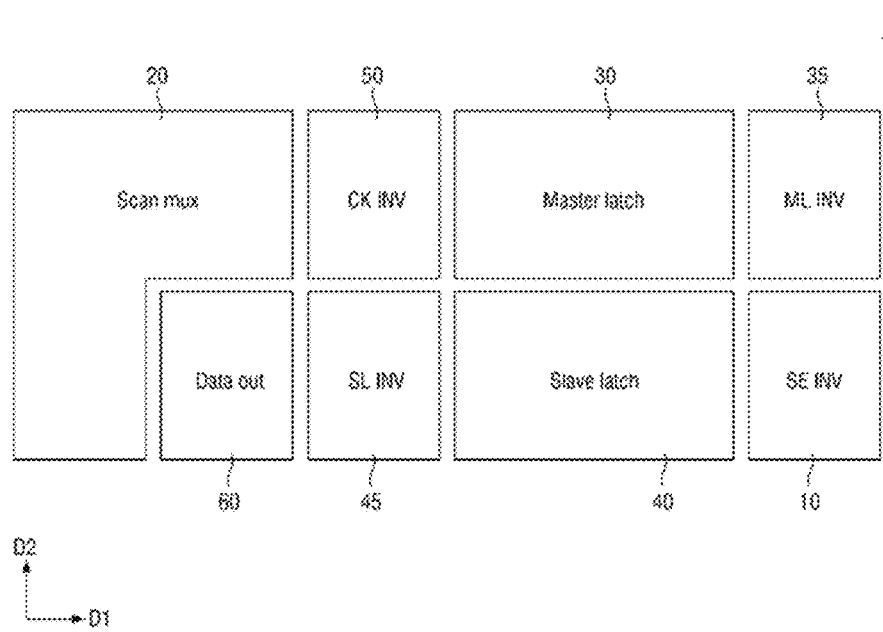

In the layout of a semiconductor device 1 of FIG. 20, an upper part of a multiplexer circuit 20, a clock inverter circuit 50, a latch circuit 30, and an inverter circuit 35 may be disposed in a first row, and a lower part of the multiplexer circuit 20, an output driver circuit 60, an inverter circuit 45, a latch circuit 40, and a scan enable inverter circuit 10 may be disposed in a second row. The length, in a direction D1, of the latch circuit 30 may be the same as the length, in the direction D1, of the latch circuit 40. The length, in the direction D1, of the inverter circuit 35 may be the same as the length, in the direction D1, of the scan enable inverter circuit 10. The length, in the direction D1, of the clock inverter circuit 50 may be the same as the length, in the direction D1, of the inverter circuit 45. The length, in the direction D1, of the upper part of the multiplexer circuit 20 may be the same as the sum of the lengths, in the direction D1, of the output driver circuit 60 and the lower part of the multiplexer circuit 20.

Figure 21:
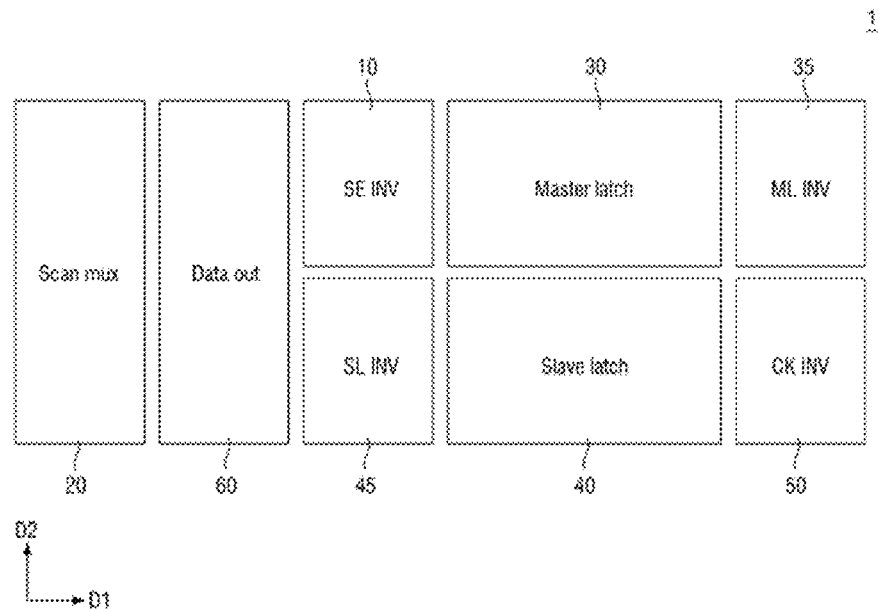
Figure 22:
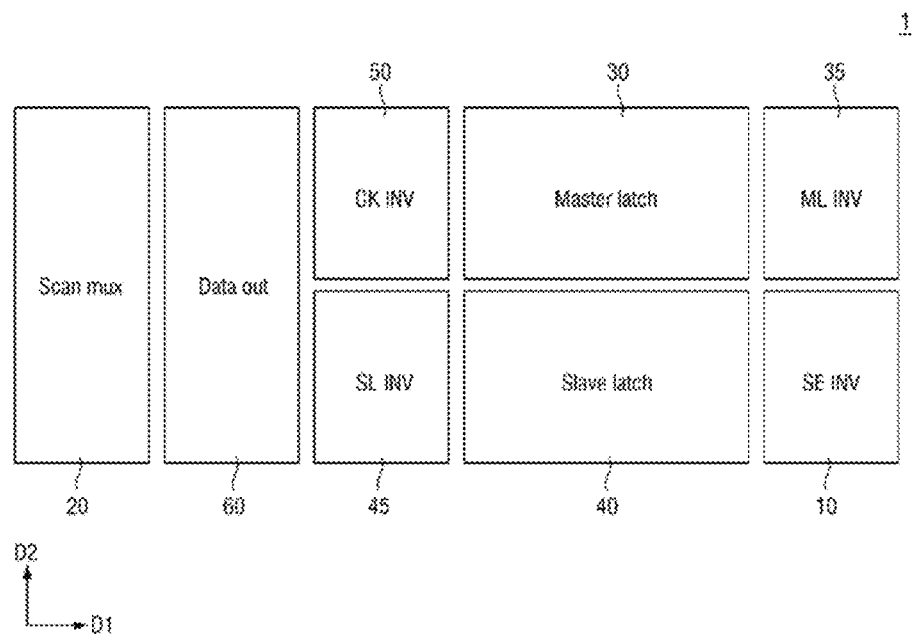

In each of the example embodiments of FIGS. 21 and 22, a multiplexer circuit 20 and an output driver circuit 60 may be disposed to extend in a direction D2 across first and second rows.

In the layout of a semiconductor device 1 of FIG. 21, a multiplexer circuit 20 and an output driver circuit 60 may be disposed across the first and second rows, a scan enable inverter circuit 10, a latch circuit 30, and an inverter circuit 35 may be disposed in the first row, starting from the middle of the first row, and an inverter circuit 45, a latch circuit 40, and a clock inverter circuit 50 may be disposed in the second row, starting from the middle of the second row, below the scan enable inverter circuit 10. The length, in a direction D1, of the inverter circuit 45 may be the same as the length, in the direction D1, of the scan enable inverter circuit 10. The length, in the direction D1, of the latch circuit 30 may be the same as the length, in the direction D1, of the latch circuit 40. The length, in the direction D1, of the clock inverter circuit 50 and the length, in the direction D1, of the inverter circuit 35.

In the layout of a semiconductor device 1 of FIG. 22, a multiplexer circuit 20 and an output driver circuit 60 may be disposed across the first and second rows, a clock inverter circuit 50, a latch circuit 30, and an inverter circuit 35 may be disposed in the first row, starting from the middle of the first row, and an inverter circuit 45, a latch circuit 40, and a scan enable inverter circuit 10 may be disposed in the second row, starting from the middle of the second row, below the clock inverter circuit 50. The length, in a direction D1, of the clock inverter circuit 50 may be the same as the length, in the direction D1, of the inverter circuit 45. The length, in the direction D1, of the latch circuit 30 may be the same as the length, in the direction D1, of the latch circuit 40. The length, in the direction D1, of the inverter circuit 35 and the length, in the direction D1, of the scan enable inverter circuit 10.

While example embodiments are described above, it is not intended that these example embodiments describe all possible forms of the inventive concept of the disclosure. Rather, the words used in the specification are words of description rather than limitation, and it is understood that various changes may be made without departing from the spirit and scope of the disclosure. Additionally, the features of various implementing example embodiments may be combined to form further example embodiments of the disclosure.

What is claimed is:

1. A semiconductor device comprising:
   a clock gate line supplying a clock signal;
   an inverted clock gate line disposed in parallel to the clock gate line and supplying an inverted clock signal;
   a first latch circuit configured to perform a first latch operation based on the clock signal and the inverted clock signal;
   a second latch circuit arranged on a first side of the first latch circuit in a first direction and configured to receive an output of the first latch circuit and perform second latch operation based on the clock signal and the inverted clock signal; and
   a clock inverter circuit arranged on a second side of the first latch circuit in a second direction perpendicular to the first direction, and configured to generate the inverted clock signal based on the clock signal,
   wherein the clock gate line and the inverted clock gate line run parallel to each other in the first direction through both the first and second latch circuits in a plan view, and
   wherein the clock gate line and the inverted clock gate line are shared by the first and second latch circuits.

2. The semiconductor device of claim 1, further comprising:
   wherein a sum of a first length of the clock inverter circuit in the second direction and a second length of the first latch circuit in the second direction is the same as a third length of the second latch circuit in the second direction.

3. The semiconductor device of claim 2, further comprising:
   a scan mux circuit arranged on a first side of the clock inverter circuit in the second direction, the first side of the clock inverter circuit being different from a second side of the clock inverter circuit on which the first latch circuit is arranged;
   an output driver circuit arranged to adjoin the scan mux circuit in the first direction and configured to output an output signal of the semiconductor device; and
   a scan enable inverter circuit arranged to adjoin the scan mux circuit in the first direction and arranged between the output driver circuit and the second latch circuit in the second direction,
   wherein a sum of a fourth length of the output driver circuit in the second direction and a fifth length of scan enable inverter in the second direction is the same as a sixth length of the scan mux circuit in the second direction.

4. The semiconductor device of claim 2, further comprising:
   a first wiring line connected to an output of the clock inverter circuit and extending in the second direction;
   a second wiring line connected to the first wiring line through a via and extending in the first direction; and
   a third wiring line connected to the second wiring line through a via and extending in the second direction,
   wherein the inverted clock gate line is connected to the third wiring line and receives the inverted clock signal.

5. The semiconductor device of claim 4, further comprising:
   a fourth wiring line connected to an input node of the clock inverter circuit and extending in the second direction,
   wherein the clock gate line is connected to the fourth wiring line and receives the clock signal.

6. The semiconductor device of claim 5, wherein the first wiring line, the third wiring line, and the fourth wiring line are disposed not to overlap each other in a first metal layer and the second wiring line is disposed in a second metal layer.

7. The semiconductor device of claim 1, wherein at least one inverted clock sub-gate line and at least one clock sub-gate line are alternately arranged in at least two columns, including first and second columns, to be spaced apart from each other, wherein the at least one inverted clock sub-gate line belongs to the inverted clock gate line and the at least one clock sub-gate line belongs to the clock gate line, wherein the first and second columns extend in the first direction and are shared by the first and second latch circuits, wherein a first inverted clock sub-gate line in the first column and a second inverted clock sub-gate line in the second column are connected to a first upper wiring line, and wherein a first clock sub-gate line in the first column and a second clock sub-gate line in the second column are connected to a second upper wiring line.

8. The semiconductor device of claim 2, wherein the clock gate line and the inverted clock gate line extend in a continuous straight line through both the first and second latch circuits.

9. The semiconductor device of claim 2, wherein
a scan mux circuit arranged on a first side of the clock inverter circuit and a first side of the second latch circuit, the first side of the clock inverter circuit being different from a second side of the clock inverter circuit on which the first latch circuit is arranged, and the first side of the second latch circuit being different from a second side of the second latch circuit on which the first latch circuit is arranged;

an output driver circuit arranged on a first side of the scan mux circuit , in the first direction and configured to a output signal of the semiconductor device, the first side of the scan mux circuit being different from a second side of the scan mux circuit on which the second latch circuit is arranged; and a scan mux enable inverter circuit arranged on the first side of the scan mux circuit in the first direction and on a second side of the output driver circuit in the second direction, and wherein a sum of a fourth length of the output driver circuit in the second direction and a fifth length of the scan enable inverter in the second direction is the same as a sixth length, in the first direction, of the scan mux circuit in the second direction.

10. A semiconductor device comprising:
a plurality of functional circuits arranged in at least two rows, including first and second rows, and configured to operate based on a clock signal and an inverted clock signal;

a clock gate line arranged to extend in a column direction and supplying the clock signal; and an inverted clock gate line arranged to extend in the column direction in parallel to the clock gate line and supplying the inverted clock signal, wherein the clock gate line and the inverted clock gate line are shared by functional circuits disposed in each of the at least two rows.

11. The semiconductor device of claim 10, wherein among the functional circuits, a first latch and a second latch are arranged in the first and second rows, respectively, and share the clock gate line and the inverted clock gate line.

12. The semiconductor device of claim 11, wherein among the functional circuits, a scan multiplexer circuit, a clock inverter circuit, and the first latch are arranged in the first row and an output driver circuit, a scan enable inverter circuit, and the second latch are arranged in the second row.

13. The semiconductor device of claim 12, wherein a sum of lengths of the clock inverter circuit and the first latch in a row direction is the same as a length of the second latch in the row direction.

14. The semiconductor device of claim 12, wherein a length of the first latch in a row direction is the same as a length of the second latch in the row direction.

15. The semiconductor device of claim 11, wherein among the functional circuits, a scan multiplexer circuit, a scan enable inverter circuit, a clock inverter circuit, and the first latch are arranged in the first row and an output driver circuit and the second latch are arranged in the second row.

16. The semiconductor device of claim 10, wherein a sum of lengths of functional circuits disposed in the first row is the same as a sum of lengths of functional circuits disposed in the second row.

17. The semiconductor device of claim 16, wherein among the functional circuits, a scan multiplexer circuit is arranged across the first and second rows and the first latch, the second latch, a clock inverter circuit, a scan enable inverter circuit, and an output driver circuit are arranged in the first and second rows such that lengths of the first and second rows become identical.

18. The semiconductor device of claim 17, wherein the first latch and the second latch share the clock gate line and the inverted clock gate line, in different rows.

19. The semiconductor device of claim 10, further comprising:
a clock inverter circuit configured to receive the clock signal and output the inverted clock signal;
a first wiring line connected to an output node of the clock inverter circuit and extending in a row direction;
a second wiring line connected to the first wiring line and extending in a column direction; and
a third wiring line connected to the second wiring line and extending in the row direction,
wherein the inverted clock gate line is connected to the third wiring line and receives the inverted clock signal.

20. The semiconductor device of claim 19, further comprising:
a fourth wiring line connected to an input node of the clock inverter circuit and extending in a row direction,
wherein the clock gate line is connected to the fourth wiring line and receives the clock signal.

21. A semiconductor device comprising:
a clock circuit configured to output a clock signal and an inverted clock signal;
a first latch circuit configured to perform a first latch operation based on the clock signal and the inverted clock signal; and
a second latch circuit configured to receive an output of the first latch circuit and perform a second latch operation based on the clock signal and the inverted clock signal;
a clock gate line configured to supply the clock signal to the first latch circuit and the second latch circuit;
an inverted clock gate line configured to supply the inverted clock signal to the first latch circuit and the second latch circuit,
wherein the clock circuit is adjacent to the first latch circuit in a first direction,
wherein the first latch circuit is adjacent to the second latch circuit in the second direction,
wherein the clock gate line and the inverted clock gate line run parallel to each other in the second direction through both the first and second latch circuits in a plan view, and wherein the clock gate line and the inverted clock gate line are parallel to each other.

* * * * *